United States Patent
Anderson

(10) Patent No.: US 6,442,008 B1
(45) Date of Patent: Aug. 27, 2002

(54) LOW LEAKAGE CLAMP FOR E.S.D. PROTECTION

(75) Inventor: Warren R. Anderson, Westborough, MA (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/450,314

(22) Filed: Nov. 29, 1999

(51) Int. Cl.$^7$ ................................................ H01H 9/00
(52) U.S. Cl. ............................ 361/56; 361/111; 361/54
(58) Field of Search ............................ 361/54, 56, 111; 257/355, 356

(56) References Cited

U.S. PATENT DOCUMENTS

| | | | | |
|---|---|---|---|---|
| 5,400,202 A | * | 3/1995 | Metz et al. ................. | 361/111 |
| 5,530,612 A | | 6/1996 | Maloney ..................... | 361/56 |
| 5,748,425 A | * | 5/1998 | Gutsch ....................... | 361/111 |
| 5,781,388 A | * | 7/1998 | Quigley ...................... | 361/111 |
| 5,978,192 A | * | 11/1999 | Young et al. ................. | 361/56 |
| 6,072,682 A | * | 6/2000 | Ravanelli et al. ........... | 361/111 |

OTHER PUBLICATIONS

Amerasekara, C.D., "The Impact of Technology Scaling on ESD Robustness and Protection Circuit Design," *EOS/ESD Symp. Pro.*, pp. 237–245 (1994).

Maloney, T.J. and S. Dabral, "Novel Clamp Circuits for IC Power Supply Protection," *EOS/ESD Symp. Proc.*, pp. 1–12 (1995).

Tandan, N., "ESD Trigger Circuit," *EOS/ESD Symp. Pro.*, pp. 120–124 (1994).

Dabral, S. et al., "Core Clamps for Low Voltage Technologies," *EOS/ESD Symp.*, pp. 141–149 (1994).

Anderson, W.R. amd D.B. Krakauer, "ESD Protection for mixed voltage I/O using NMOS transistors stacked in a cascode configuration," *Microelectronics Reliability* 39, pp. 1521–1529 (1999).

Voldman, S.H. et al., "Analysis of Snubber–Clamped Diode– String Mixed Voltage Interface ESD Protection Network for Advanced Microprocessors," *EOS/ESD Symp.*, pp. 43–61 (1995).

Mack, W.D. and R.G. Meyer, "New ESD Protection Schemes for BiCMOS Processes with Application to Cellular Radio Designs," *Int. Symp. of Circuits and Systems*, pp. 2699–2702 (1992).

Duvvury, C. et al., "Internal Chip ESD Phenomena Beyond the Protection Circuit," *IEEE Trans. Electron Devices*, vol. 35, pp. 2133–2139 (1998).

(List continued on next page.)

*Primary Examiner*—Kim Huynh
(74) *Attorney, Agent, or Firm*—Hamilton Brook Smith & Reynolds, P.C.

(57) ABSTRACT

An improved MOS IC is disclosed having a low standby current ESD voltage clamp for the power and ground pads. The ESD voltage clamp uses the vertical PNP transistors inherently available in CMOS device fabrication by using the P+ source drain regions as the emitter, the N+ source drains as base contacts, the N wells as bases, and the P substrate as collectors. Thus the advantages of rapid voltage spike protection may be obtained with no increase in the number of masking steps or device fabrication complexity. The vertical PNP bipolar transistors are arranged in a Darlington configuration with the last transistor in the chain having a base region connected to both a resistor charging network connected to the power supply, and a capacitive network connected to the ground potential. A PMOS transistor is attached across the emitter and base of the last bipolar transistor in the Darlington chain to reduce the voltage overshoot and regulate the charge on the capacitor network.

22 Claims, 3 Drawing Sheets

OTHER PUBLICATIONS

Cook C. and S. Daniel, "Characterization of New Failure Mechanisms Arising from Power–Pin ESD Stressing," *EOS/ESD Symp. Proc.*, pp. 149–156 (1993).

Dabral, S. et al., "Designing On–Chip Power Supply Coupling Diodes for ESD Protection and Noise Immunity," *EOS.ESD Symp. Proc.*, pp. 239–249.

Wang C., "Voltage–Current Characteristic Model for Gate–Oxide Short Induced Standby Current Failures in CMOS ICs," *EOS/EDC Symp. Proc.*, pp. 246–251 (1987).

Diaz, C. and G. Motley, "Bi–modal Triggering for LVSCR ESD Protection Devices," *EOS/ESD Symp. Proc.*, 1994 (pp. 106–112).

Croft, G.D., ESD Protection Using a Variable Voltage Supply Clamp, *EOS/ESD Symp. Proc.*, 1994 (pp. 135–140).

Krakauer, D. et al., "Circuit Interactions During Electrostatic Discharge," *EOS/ESD Symp. Proc.*, 1994 (pp. 113–119).

* cited by examiner

LOW LEAKAGE CLAMP FOR E.S.D. PROTECTION

BACKGROUND OF THE INVENTION

This invention relates generally to the fabrication of Metal Oxide Semiconductor Field Effect Transistors (MOSFETs or MOS) integrated circuits (ICs), and more particularly to the fabrication of Complementary MOS (CMOS) ICs having vertical PNP bipolar transistors providing electrostatic discharge (ESD) protection for input/output (IO) power and ground pads.

As is known in the art, complex high speed IC circuits may require voltage clamps on IO pads to provide protection from sudden voltage swings outside of the designed values for sensitive MOS transistors. Such voltage swings may be caused by power supply instability, or by electrostatic discharge (ESD). ESD may be due to ungrounded human contact with the IC, for example, after walking on carpeting. ESD may cause MOS devices to suffer gate oxide rupture, causing current leakage and defective IC operation.

Current trends in MOS device design tend to increase the device sensitivity to ESD and other voltage swings. A MOS transistor may operate faster if the gate oxide thickness is reduced. However, thinner gate oxide also means greater sensitivity to typical voltage spikes which may destroy the thinner gate oxide. Lower voltage operation of MOS devices may also provide lower power dissipation. Another known method of reducing power dissipation is to use CMOS logic. As is well known in the art, lower power dissipation means lower operating temperatures and better device reliability. Low power dissipation is especially important for portable devices such as cellular phones, personal digital assistants and laptop computers, etc.

There are methods known in the art to provide 10 power and ground clamps for low voltage CMOS devices. However, there is a known problem with low powered low voltage CMOS devices because typical voltage clamp protection methods either dissipate too much standby current to be acceptable for low powered CMOS devices, or do not switch enough current away from the CMOS gates to provide the desired level of ESD spike protection. This clamp problem results in an undesirable compromise in CMOS devices between balancing the sharpness of the high voltage cutoff versus the unacceptable amount of standby current generated.

Thus a problem exists in the art of providing rapid ESD protection for IO power and ground supply pads, while minimizing voltage clamp standby power dissipation.

SUMMARY OF THE INVENTION

In accordance with the invention, an integrated circuit input/output power supply voltage clamp is provided, comprising a series of bipolar transistors each having an emitter region electrically connected to either a power pad or to the base region of the preceding transistor. Each one of the bipolar transistors has a collector region electrically connected to a ground supply pad. At least one of the bipolar transistors has the base region connected to one terminal of a capacitor, the second capacitor terminal being connected to ground. The base region is also connected to a resistor network attached to the power supply. With such an arrangement, the chain of bipolar transistors rapidly turn on when the input pad voltage exceeds the safe design limit. Further, the chain of bipolar transistors can conduct a large amount of charge from the power pad to the ground pad, thereby protecting the sensitive MOS circuitry. During standby conditions when the input pad voltage is within safe limits, the capacitor causes the bipolar chain to shut off, thereby reducing the standby power dissipation to acceptable limits for CMOS IC devices. These benefits are provided without complex transistor etworks which increase device size and cost.

In an embodiment of the invention, the string of bipolar transistors is connected in what is known as a Darlington configuration with the first bipolar transistor having the emitter connected to the power supply, and the base connected to the emitter of the next transistor. All of the transistor collectors are part of a common collector connected to ground. The base region of the last transistor is connected to a capacitor network and to a resistor network, connected respectively to ground and power supplies.

In another embodiment of the invention, there is a MOS transistor added to the circuit having a source region connected to both the base of the next to last bipolar transistor as well as to the emitter of the last bipolar transistor. The MOS transistor has a drain region connected to the base of the last bipolar transistor and to the capacitor and resistor networks. This additional MOS transistor provides overshoot and oscillation damping for the initial portion of a rapid voltage spike or static discharge. This transistor provides a current path for the capacitor's over charge to the emitter region of the bipolar transistor.

BRIEF DESCRIPTION OF THE DRAWINGS

The foregoing features of this invention, as well as the invention itself, may be more fully understood from the detailed description read together with the accompanying drawings, in which.

Figure 1:
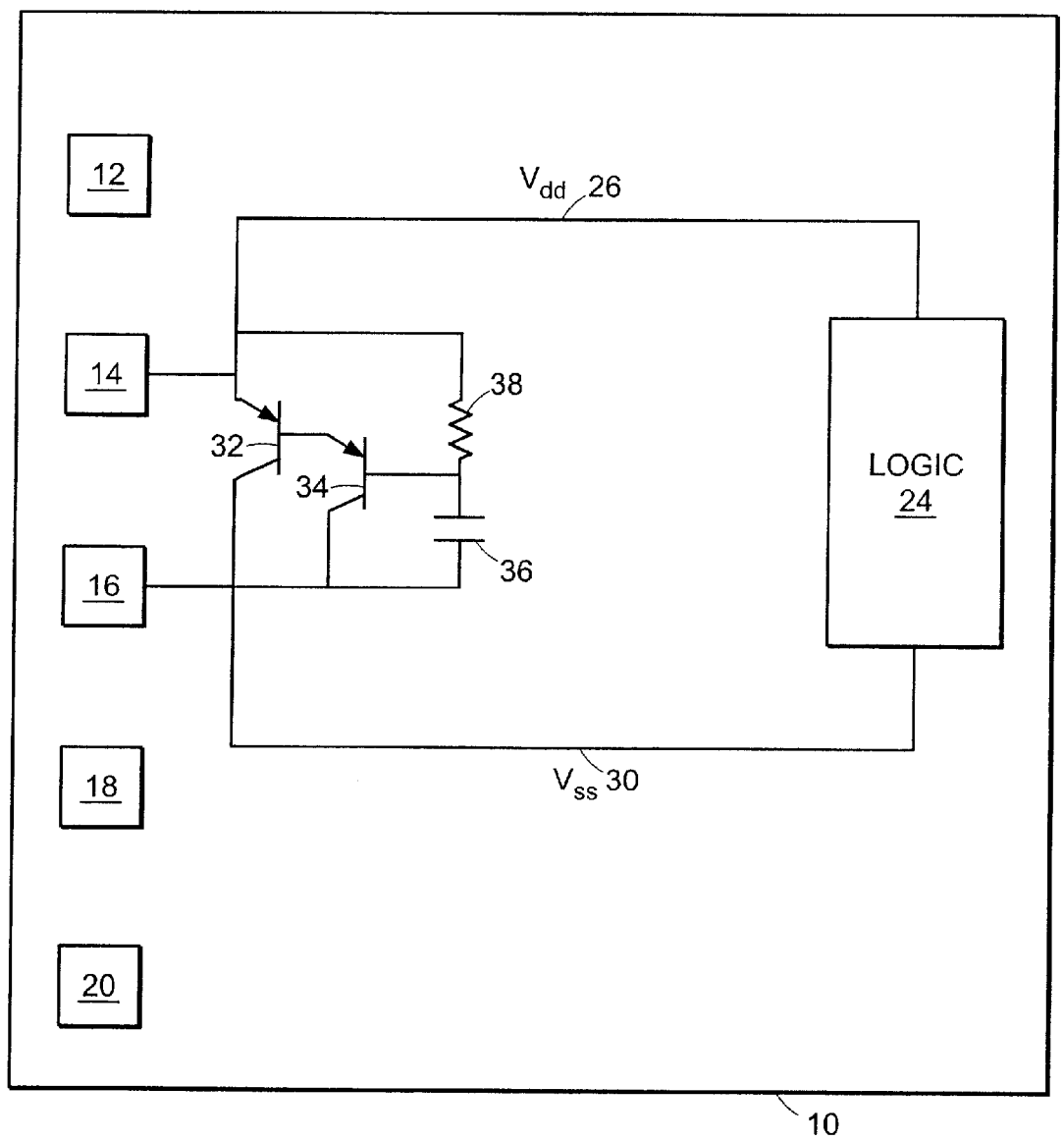
FIG. 1 is a circuit schematic of a voltage clamp in accordance with the invention.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Referring now to FIG. 1, an integrated circuit (IC) 10, preferably CMOS, has input/output (10) pads 12,14,16,18 and 20, of which pad 14 is shown as the power supply (i.e., Vdd) for a block of logic elements 24, and pad 16 is shown as the ground reference voltage (i.e., Vss) for logic block 24. Typically, there would likely be numerous sets of power and ground pads such as 14 and 16 scattered around the perimeter of IC 10 to provide sufficient power and ground connections and capacity for smooth IC operation.

The remaining pads 12, 18 and 20 are intended to represent signal inputs and outputs and would likely also be connected to selected MOS transistors within logic block 24. As is known in the art, excessive voltage levels on pads 14 and 16 may have deleterious effects on both the electrical operation and lifetime of MOS transistors in logic block 24. Electro-static discharge (ESD) may cause rapid increases in voltage levels at pad 14, potentially resulting in ruptured transistors in logic 24, and consequently a device field failure.

Typically, IC manufacturers provide IO pads, such as 14 and 16, with some sort of voltage level sensitive direct connection so that large voltage excursions on either the Vdd 26 or Vss 30 lines do not destroy transistors in the logic region 24. This is known as voltage clamping, or in the case of power and ground supply lines, a power supply clamp. Many different clamping methods have been used in the art to provide the ability to rapidly prevent damaging voltage surges without destroying the clamp itself.

One such method is to place a thick film MOS transistor between IO pads 14 and 16 with the gate attached to the Vdd line 26. The thickness of the film and other device properties are chosen such that when the voltage on Vdd line 26 exceeds the danger point, the MOS transistor turns on and current flows directly between Vdd pad 14 and Vss pad 16, thereby protecting the logic 24 from damage. Such clamps are difficult to provide because they require a different gate oxide thickness than all of the other transistors in the IC.

Another known method of power supply clamping places bipolar transistors such as 32 and 34 in an arrangement known as a Darlington string. In such a Darlington clamp the base of the last transistor in the chain, i.e., transistor 34 shown in FIG. 1, would be directly attached to the Vss line 30. Power supply clamps of this type have a problem with regard to low power CMOS circuits because they have a relatively large leakage current when they are in the off state, (i.e., during normal operation), and this leakage becomes worse as the temperature of the device increases, as is the case in typical high speed CMOS device operation.

There have been attempts to use the high speed response of bipolar transistors in power supply voltage clamps by designing circuits which will actively turn the bipolar transistor off during normal operation, and thus reduce the leakage current problem. Such arrangements suffer from the large number of additional transistors, resistors, diodes and capacitors required in addition to the bipolar transistors of the Darlington chain itself. Such clamps have a disadvantage that leakage in the circuit at the last transistor in the chain will be amplified back through the Darlington chain, potentially causing unacceptable leakage levels at the first emitter junction. Examples of such arrangements may be found in FIG. 10 of U.S. Pat. No. 5,530,612 issued to T. J. Maloney on Jun. 25, 1996.

The present method provides that the last bipolar transistor in the chain has the base connected to both a capacitor 36 which connects to the Vss line 30, and a resistor network 38, known as a shunt, which connects to the Vdd line 26. Note that while FIG. 1 shows only two transistors 32 and 34 in the chain, in general the number of transistors may be much larger. Further note that the resistor 38 may be provided by the inherent resistance of an active electronic component, such as in the use of what is commonly known as a depletion load transistor. Depletion load transistors may be obtained either by adjustment of the doping level of the transistor channel region, or by connecting the gate region of a P type MOS transistor to Vss, or by connecting the gate region to Vdd for a N type MOS transistor.

It should be further noted that the transistor areas of transistors 32 and 34, as well as any subsequent transistors in the chain that are not shown in the figure, may be selected to result in each subsequent transistor having a smaller size area than the preceding transistor. This provides a voltage clamping device that has a reduced area consumption, and thus results in smaller and less expensive circuits.

The clamp works by acting as a string of forward biased diodes, where the emitter and base regions of the two bipolar transistors 32 and 34 form the diodes. As the voltage on the Vdd line 26 increases beyond the designed level, the excess current is transferred or shunted to the Vss line 30 through the emitter region of transistor 32, across the base region and out through both the collector of transistor 32 and the emitter of transistor 34, and so on in a progressive string of cascading transistors. The voltage at which this occurs is dependent upon the physical area of the transistor 32 and on the sharpness of the junction. Since there is more current capacity in the collector region of a bipolar transistor than in the base region, most of the current in transistor 32 goes out the collector region to the Vss line and thus the physical size of transistor 34 may be made smaller than transistor 32, and so on for each successive transistor in the chain.

A benefit of this arrangement is that the shunt network 38 acts as a charging network and reduces the maximum charging current that may occur during power-up transients. In addition, the capacitor 36 charges up and turns the transistor chain off during normal operations. During a sudden change in voltage the current from capacitor 36 turns the transistor chain on.

Note that the figure shows the shunt network 38 and the capacitance 36 to be a simple lumped resistor and a simple discrete capacitor respectively. Typical charging networks such as 38 may consist of several resistors, depletion mode transistors and other devices in various combinations. The capacitance 36 may likewise be provided by a combination of capacitors and transistors, or other electrical components. In a preferred embodiment the resistor 38 will have a value of about 100K Ohms.

Figure 2:
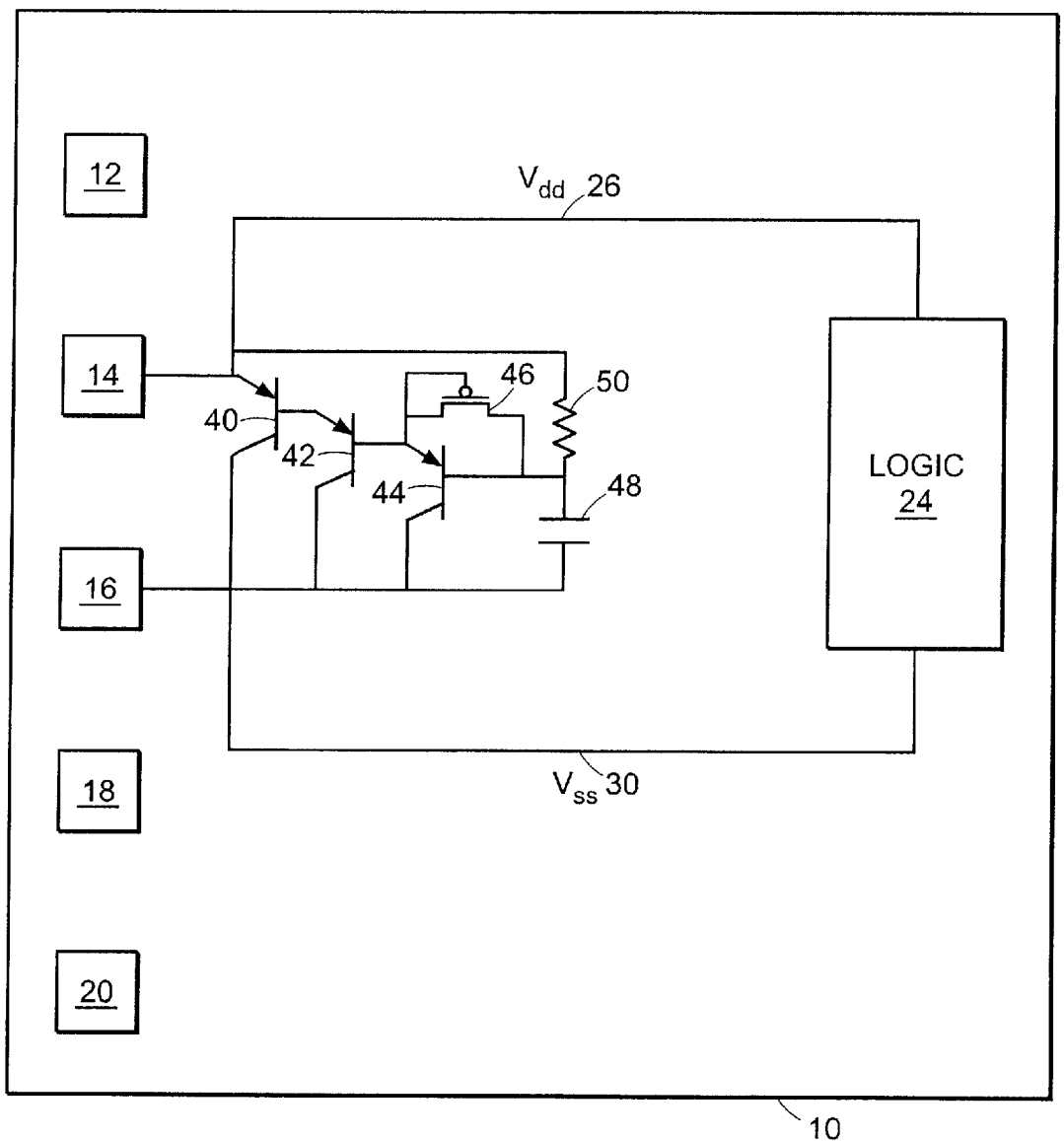
FIG. 2 shows an alternative embodiment of the voltage clamp of FIG. 1.

Referring now to FIG. 2, an alternative embodiment of the invention is shown to have an additional MOS transistor 46, preferably a P channel transistor, whose source is coupled to the MOS gate and to the emitter of the last transistor 44, preferably a PNP bipolar transistor, in the Darlington chain of transistors 40, 42 and 44. Note that FIG. 2 shows three transistors in the chain, but typically the number of transistors may be greater. The drain of the MOS transistor 46 is connected to capacitor 48 and shunt array 50 in a similar fashion to the previously disclosed embodiment. The additional transistor 46 helps reduce the voltage overshoot during the initial part of the high speed voltage surge or ESD pulse. Because of bipolar base transit time and turn-on effects during the beginning of the voltage pulse, the PNP bipolar transistors 40,42, and 44, initially act as simple diodes, shunting all of the excess charge onto the capacitor 48, and thereby raising the voltage seen across the capacitor 48. If left alone this charge would create an offset voltage which will operate to shift the clamping voltage of the circuit. After the PNP bipolar transistors 40, 42 and 44 begin to conduct the excess current with true bipolar transistor action, the lower series resistance results in a collapse of the emitter to base voltage of the transistors 40, 42, and 44, thus lowering the emitter voltage of transistor 44 below its base voltage requirement. The MOS transistor 46 acts to remove the offset voltage on the capacitor 48 by conducting the capacitors charge back into the emitter for transistor 46, which shunts most of the excess charge to the Vss line 30.

In either of the alternative embodiments discussed above, the problem of voltage supply clamping is solved in a simple and cost effective method as compared to the thick film MOS transistors, the standard Darlington chain, or the large number of additional transistors, capacitors, resistors and diode arrays required by the power supply voltages clamps described above. Thus the present arrangement provides a voltage clamp on power supply pads to protect the logic transistors from harmful ESD and power-on events by sharply limiting voltage excursions while providing sub-nano-amp leakage currents during normal operation.

Figure 3:
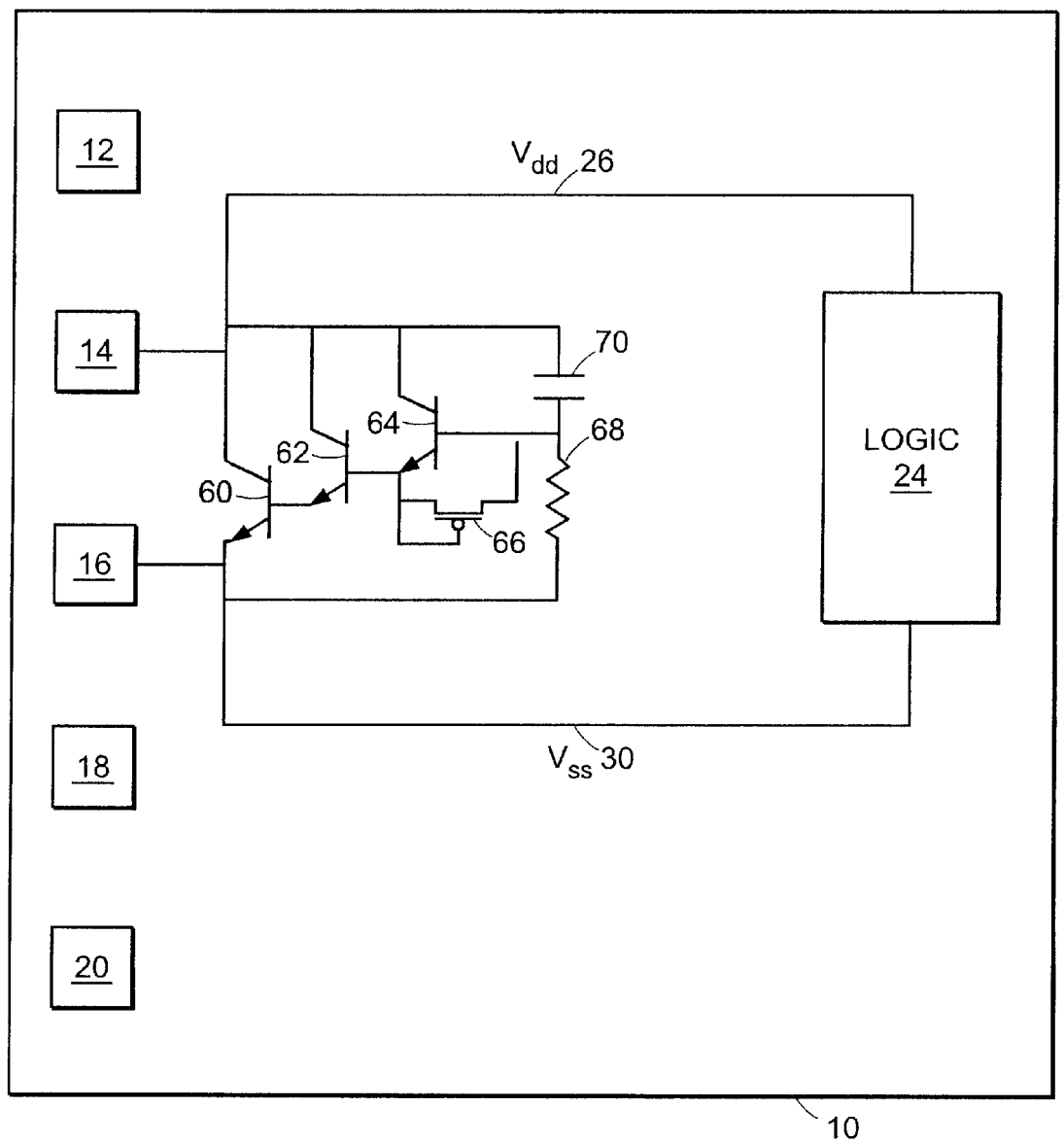
FIG. 3 shows an alternative embodiment of the invention using inverted polarity transistors.

Referring now to FIG. 3, an alternative embodiment of the invention is shown having a string of linked NPN bipolar transistors 60, 62 and 64, connected to a Vdd line 26 through their collector regions. The emitter of the first transistor 60 in the string is connected to the Vss line 30, and the base regions are each connected to the emitter of the next transistor. The last transistor, 64 has its base connected to the resistor network 68 to Vss line 30, and through a capacitive element 70 to Vdd line 26. Transistor 64 is also connected to MOS transistor 66, preferably an NMOS transistor, which acts as previously described regarding transistor 46 in FIG. 2, to reduce the capacitor overshoot.

Having described preferred embodiments of the invention, it will now be apparent to those skilled in the art that other embodiments incorporating its concept may be provided. It is felt therefore, that this invention should not be limited to the disclosed embodiment, but should be limited only by the spirit and scope of the appended claims.

While this invention has been particularly shown and described with references to preferred embodiments thereof, it will be understood by those skilled in the art that various changes in form and details may be made therein without departing from the scope of the invention encompassed by the appended claims.

What is claimed:

1. An integrated circuit power supply voltage clamp, comprising:
    at least two bipolar transistors;
    at least two power supply pads including a first power supply pad and a second power supply pad;
    each bipolar transistor having an emitter region, a base region and a collector region;
    the emitter region of a first bipolar transistor electrically connected to the first power supply pad;
    the base region of the first bipolar transistor electrically connected only to the emitter region of a second bipolar transistor;
    the collector region of each of the bipolar transistors electrically connected to at least the second power supply pad;
    the base region of the second bipolar transistor electrically connected to a first terminal of a capacitor, the capacitor having a second terminal electrically connected to at least the second power supply pad; and
    the base region of the second bipolar transistor connected to the capacitor also being connected to an electrical terminal of a resistor network, the resistor network having a second electrical terminal connected to the first power supply pad.

2. The apparatus of claim 1 wherein the resistor network is comprised of at least one transistor having a gate region connected to a drain region.

3. The apparatus of claim 1 wherein the plurality of bipolar transistors are PNP type bipolar transistors.

4. The apparatus of claim 1 wherein the plurality of bipolar transistors are vertical PNP type transistors.

5. The apparatus of claim 1 wherein the bipolar transistor having a base region electrically connected to the capacitor has a transistor connected between the base and emitter regions.

6. The apparatus of claim 1 wherein the plurality of bipolar transistors have a single common collector region.

7. The apparatus of claim 1 wherein the first one of the plurality of power supply pads is a power supply voltage, and the second one of the plurality of power supply pads is a ground supply voltage.

8. The apparatus of claim 1 wherein the plurality of bipolar transistors are electrically connected in a Darlington configuration.

9. The apparatus of claim 8 wherein the at least one of the plurality of bipolar transistors having a base region electrically connected to a terminal of a capacitor, is the last base region in the Darlington configuration.

10. The apparatus of claim 1, wherein at least one intermediate bipolar transistor is electrically connected between the first and second bipolar transistors, the intermediate bipolar transistors having an emitter region, a base region and a collector region.

11. The apparatus of claim 10, wherein the emitter region of the intermediate bipolar transistor is electrically connected to the base region of a preceding transistor and the base region of the intermediate bipolar transistor is electrically connected to the emitter region, of a succeeding transistor.

12. An integrated circuit power supply voltage clamp, comprising:
    a plurality of bipolar transistors electrically connected in a Darlington configuration having at least a first bipolar transistor and a last bipolar transistor;
    the first bipolar transistor having an emitter region electrically connected to a power supply pad;
    each individual one of the plurality of bipolar transistors having a collector region electrically connected to a ground supply pad;
    a base region of a preceding bipolar transistor of the Darlington configuration electrically connected only to an emitter region of a succeeding bipolar transistor of the Darlington configuration;
    the base region of the last bipolar transistor electrically connected to a terminal of a capacitor;
    the capacitor having a second terminal electrically connected to the ground supply pad;
    the base region of the last bipolar transistor electrically connected to an electrical terminal of a resistor network, the resistor network having a second electrical terminal connected to the power supply pad;
    a MOS transistor having one of a source or drain region connected to the base of the next to last bipolar transistor and to the emitter of the last bipolar transistor; and the other of the MOS transistor source or drain region connected to the base of the last bipolar transistor and to the capacitor and the resistor network.

13. The apparatus of claim 12 wherein the resistor network is a single resistor.

14. The apparatus of claim 12 wherein the resistor has a value of approximately one hundred thousand ohms.

15. The apparatus of claim 12, wherein the resistor network comprises a MOS transistor having a gate region electrically connected to a source region.

16. The apparatus of claim 15 wherein the MOS transistor is a PMOS transistor and the gate is electrically connected to said ground pad.

17. The apparatus of claim 15 wherein the MOS transistor is a NMOS transistor and the gate is electrically connected to said power pad.

18. The apparatus of claim 15 wherein the MOS transistor is a depletion mode transistor having a predetermined current capacity.

19. The apparatus of claim 12 wherein further an additional bipolar transistor has a base region connected to the emitter of the first transistor in the Darlington chain and to the power pad, an emitter region connected to the base of the last transistor in the Darlington chain, the MOS transistor drain, the resistor network and the capacitor, and a collector region connected to the ground supply pad.

20. The apparatus of claim 12 wherein the gate region and the substrate contact of the MOS transistor are electrically attached to the base of the next to last bipolar transistor and to the emitter of the last bipolar transistor.

21. The apparatus of claim 12 wherein further each one of the string of Darlington transistors is smaller than the transistor to which its emitter is coupled.

22. A method of power supply clamping a CMOS circuit, comprising the steps of:

connecting a plurality of bipolar transistors in a Darlington configuration having at least a first bipolar transistor and a last bipolar transistor;

electrically connecting an emitter region of the first bipolar transistor to a power supply connection;

electrically connecting a collector region of each one of the plurality of transistors to a ground supply connection;

electrically connecting a base region of a preceding bipolar transistor of the Darlington configuration only to an emitter region of a succeeding bipolar transistor of the Darlington configuration;

electrically connecting the base region of the last bipolar transistor to a capacitor network connection and a resistor network connection; electrically connecting a second terminal of the capacitor network to the ground supply connection, and electrically connecting a second terminal of the resistor network to the power supply connection; and electrically connecting a MOS transistor source region to the base region of the next to last bipolar transistor and to the emitter region of the last bipolar transistor, and electrically connecting the MOS transistor drain region to the base region of the last bipolar transistor and to the capacitor and resistor networks.

* * * * *